(12) United States Patent
Migita et al.

(10) Patent No.: US 8,569,181 B2
(45) Date of Patent: Oct. 29, 2013

(54) MANUFACTURING METHOD OF SEMICONDUCTOR APPARATUS AND SEMICONDUCTOR APPARATUS (75) Inventors: Tatsuo Migita, Kanagawa (JP); Hirokazu Ezawa, Tokyo (JP); Tadashi Iijima, Kanagawa (JP); Takashi Togasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/267,048

(22) Filed: Oct. 6, 2011

(65) Prior Publication Data
US 2012/0028463 A1 Feb. 2, 2012

Related U.S. Application Data (62) Division of application No. 12/355,673, filed on Dec. 16, 2008, now Pat. No. 8,063,487.

(30) Foreign Application Priority Data

Dec. 17, 2007 (JP) ................................ 2007-324934

(51) Int. Cl.
*H01L 21/461* (2006.01)
*H01L 21/38* (2006.01)

(52) U.S. Cl.
USPC ............ 438/738; 438/553; 438/733; 438/736

(58) Field of Classification Search
USPC .................. 438/689, 706, 735, 736
See application file for complete search history.

(56) References Cited

U.S. PATENT DOCUMENTS

| 5,821,626 | A | 10/1998 | Ouchi et al. |
| 5,920,796 | A * | 7/1999 | Wang et al. ................. 438/700 |
| 6,211,052 | B1 | 4/2001 | Farnworth |
| 6,511,901 | B1 | 1/2003 | Lam et al. |

(Continued)

FOREIGN PATENT DOCUMENTS

| JP | 7-122604 | 5/1995 |
| JP | 9-205096 | 8/1997 |
| JP | 2006-210438 | 8/2006 |
| JP | 2006-237159 | 9/2008 |

OTHER PUBLICATIONS

Notice of Rejection issued by the Japanese Patent Office on Apr. 24, 2012, for Japanese Patent Application No. 2007-324934, and English-language translation thereof.

(Continued)

*Primary Examiner* — Walter H Swanson
*Assistant Examiner* — Wilner Jean Baptiste
(74) *Attorney, Agent, or Firm* — Finnegan, Henderson, Farabow, Garrett & Dunner, L.L.P.

(57) ABSTRACT

A first conducting layer is formed on a side of a main surface on which an electrode terminal of a semiconductor device is provided in a semiconductor substrate. The first conducting layer is electrically connected to the electrode terminal of the semiconductor device. A mask layer that has an opening at a predetermined position is formed on the first conducting layer. A second conducting layer is formed inside the opening of the mask layer. The mask layer is removed. A relocation wiring that includes the first conducting layer and electrically draws out the electrode terminal is formed by performing anisotropic etching for the first conducting layer using the second conducting layer as a mask. Finally, a bump is formed on the relocation wiring by causing the second conducting layer to reflow.

9 Claims, 9 Drawing Sheets

(56) References Cited

U.S. PATENT DOCUMENTS

| | | |
|---|---|---|
| 7,122,458 B2 | 10/2006 | Cheng et al. |
| 2003/0119297 A1* | 6/2003 | Lam et al. ............. 438/612 |
| 2003/0157792 A1 | 8/2003 | Tong et al. |
| 2004/0201097 A1 | 10/2004 | Ohsumi |
| 2005/0176231 A1 | 8/2005 | Shei et al. |
| 2006/0090921 A1 | 5/2006 | Sato et al. |
| 2006/0189114 A1* | 8/2006 | Seto et al. ............. 438/597 |
| 2007/0105359 A1* | 5/2007 | Daubenspeck et al. ....... 438/612 |
| 2008/0217769 A1 | 9/2008 | Yanase et al. |

OTHER PUBLICATIONS

Decision of Refusal, issued by the Japanese Patent Office on Mar. 19, 2013, for Japanese Patent Application No. 2007-324934, and English-language translation thereof (3 pages).

* cited by examiner

MANUFACTURING METHOD OF SEMICONDUCTOR APPARATUS AND SEMICONDUCTOR APPARATUS

CROSS-REFERENCE TO RELATED APPLICATIONS

This is a division of application Ser. No. 12/335,673, filed Dec. 16, 2008, now U.S. Pat. No. 8,063,487 which is incorporated herein by reference.

This application is based upon and claims the benefit of priority from the prior Japanese Patent Application No. 2007-324934, filed on Dec. 17, 2007; the entire contents of which are incorporated herein by reference.

BACKGROUND OF THE INVENTION

1. Field of the Invention

The present invention relates to a manufacturing method of a semiconductor apparatus and the semiconductor apparatus.

2. Description of the Related Art

In recent years, in order to achieve high integration and high functionality of semiconductor devices, enhancement of operation speed of device and increase of memory capacity are required. Recently, a COC (Chip on Chip) device in which a logic chip and a large-capacity DRAM are built up has also been developed as a substitute for an eDRAM (Embedded Dynamic Random Access Memory) chip.

Normally, in a COC device, solder bumps, gold bumps and the like are used for connecting chips to each other. In addition, bonding wires and relocation wirings such as gold (Au) plated wiring and copper (Cu) plated wiring are used for a power supply and the like in COC connected chips. Wiring interval becomes narrower and the diameter of the solder bump becomes smaller as the high integration of semiconductor device advances. Therefore, when performing connections using relocation wirings of Cu plated wiring and using solder bumps, there is a problem that wiring resistance and resistance between chips increases. There has been a need to reduce these resistances.

A technology related to such relocation wiring or forming a solder bump, for example, has been disclosed in JP-A 2006-237159 (KOKAI). In this technology, a resist mask having an opening is formed on a conducting layer on a wafer, and a plating film is formed inside the opening by using the technique of plating by supplying current to the conducting layer to form relocation wiring or a solder bump of the plating film.

However, the technique described in JP-A 2006-237159 (KOKAI) is too complicated. Because, when forming relocation wiring and a solder bump, patterning had to be performed on the resists beforehand, respectively, and then the relocation wiring and the solder bump were plated on the opening portion of the pattern.

BRIEF SUMMARY OF THE INVENTION

According to an aspect of the present invention, there is provided a manufacturing method of a semiconductor apparatus including forming a first conducting layer on a side of a main surface on which an electrode terminal of a semiconductor device is provided in a semiconductor substrate, the first conducting layer being electrically connected to the electrode terminal of the semiconductor device; forming a mask layer that has an opening at a predetermined position on the first conducting layer; forming a second conducting layer inside the opening of the mask layer; removing the mask layer; forming a relocation wiring that includes the first conducting layer and electrically draws out the electrode terminal by performing anisotropic etching for the first conducting layer using the second conducting layer as a mask; and forming a bump on the relocation wiring by causing the second conducting layer to reflow.

According to another aspect of the present invention, there is provided a semiconductor apparatus including a semiconductor substrate on a surface of which an electrode terminal of a semiconductor device is provided; an insulating layer that is formed above the surface on which the electrode terminal of the semiconductor device is provided and has an opening for at least a part of region of the electrode terminal; a relocation wiring that is provided at least by infilling the inside of the opening, and that is electrically connected to the electrode terminal; and a bump provided in the entire surface on the relocation wiring.

DETAILED DESCRIPTION OF THE INVENTION

Exemplary embodiments of the present invention in accordance with a manufacturing method of a semiconductor apparatus and the semiconductor apparatus will be explained in detail with reference to the accompanying drawings. The present invention is not limited by the following descriptions, but modifications may be properly made without departing from the spirit and scope of the present invention.

Figure 1A:
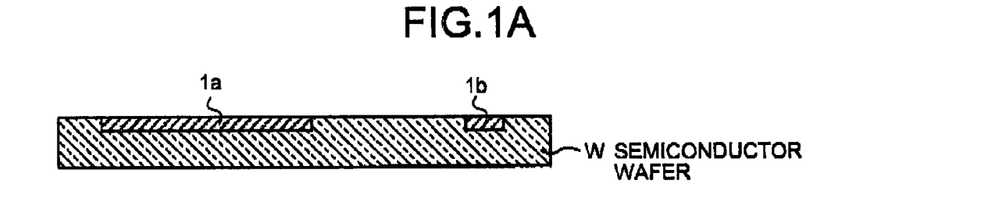
FIGS. 1A to 1C are schematic diagrams illustrating a manufacturing method in accordance with an embodiment of the present invention.

A first embodiment of the present invention is explained below. FIGS. 1A to 3B are schematic diagrams illustrating a manufacturing method of a semiconductor apparatus in accordance with a first embodiment of the present invention. First, a semiconductor wafer (substrate) used in this embodiment of the present invention is explained. As shown in FIG. 1A, electrode pads 1a and 1b as electrode terminals of a semiconductor device (not shown) are formed on the surface of a semiconductor wafer W (hereinafter, "wafer W" or "substrate W"). The wafer W is made of silicon or the like. The semiconductor device is a transistor or the like. A material of the electrode pads 1a and 1b includes, for example, aluminum (Al). In the first embodiment, an instance that the electrode pads 1a and 1b are made from Al is explained. By using the wafer W on which such electrode pads 1a, 1b and the like are formed, the following steps are performed.

Figure 1B:
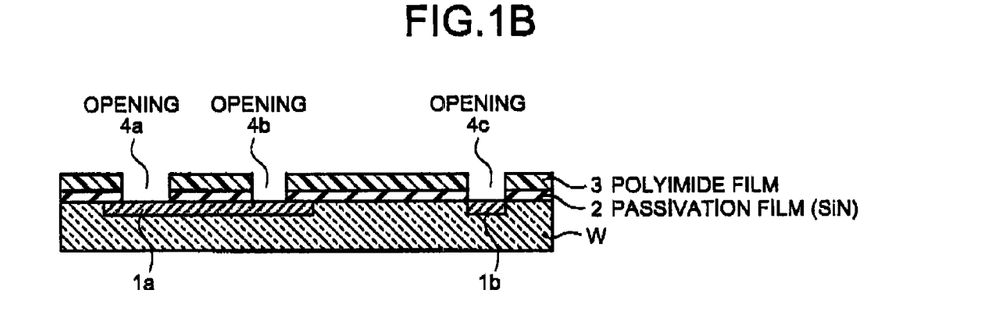

First, as shown in FIG. 1B, a passivation film 2 and a polyimide film 3 that have openings 4a, 4b, and 4c at predetermined positions on the electrode pads 1a and 1b are formed in this order on the entire surface of the wafer W. A material of the passivation film 2 includes, for example, silicon nitride (SiN). In this embodiment, an instance that the passivation film 2 is made from SiN is explained.

The passivation film 2 and the polyimide film 3 are formed with the following method. That is, first, the passivation film 2 (SiN film) and the polyimide film 3 are formed on the entire surface of the wafer W. Subsequently, a resist pattern having openings at predetermined positions (positions corresponding to the openings 4a, 4b, and 4c) on the electrode pad 1a and 1b is formed on the polyimide film 3, and by using this resist pattern as a mask, the passivation film 2 and the polyimide film 3 that have the openings 4a, 4b, and 4c at the predetermined positions on the electrode pads 1a and 1b are formed by using the technique of etching. Although the polyimide film 3 is formed on the passivation film 2 in this embodiment, it is not mandatory to form the polyimide film 3.

Figure 1C:
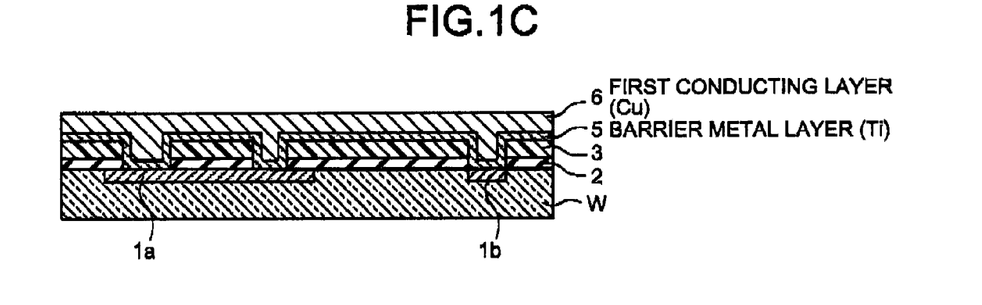

Next, as shown in FIG. 1C, a barrier metal layer 5 and a thick film of a first conducting layer 6 that functions a relocation wiring layer as under bump metal (UBM) layers are formed by using the technique of sputtering. Because the openings 4a, 4b, and 4c are present in the passivation film 2 and the polyimide film 3 at predetermined portions on the electrode pads 1a and 1b, the barrier metal layer 5 contacts with the electrode pads 1a and 1b at those predetermined portions on the electrode pads 1a and 1b.

Materials of the barrier metal layer 5 include titanium based materials, such as titanium (Ti) and tungsten titanium (TiW). On the other hand, a material of the first conducting layer 6 includes, for example, copper (Cu). In this embodiment, an instance that the barrier metal layer 5 is a Ti film of thickness 100 nanometer (nm), and the first conducting layer 6 is a Cu film of thickness 5 micrometer (μm) is explained. Incidentally, the barrier metal layer 5 can have a multilayer structure.

Figure 2A:
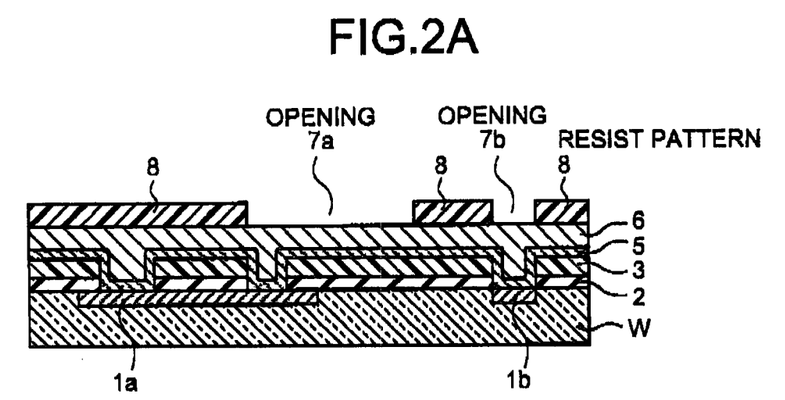
FIGS. 2A to 2C are schematic diagrams illustrating a manufacturing method in accordance with an embodiment of the present invention.

After the barrier metal layer 5 and the first conducting layer 6 have been formed, as shown in FIG. 2A, a resist pattern 8 as a mask layer having openings 7a and 7b is formed on the first conducting layer 6 by a normal lithography process of photoresist application, exposure, and development. These openings 7a and 7b are formed at positions where relocation wirings and solder bumps are to be formed. Specifically, the opening 7a is formed on a region including the electrode pad 1a, and the opening 7b is formed on the electrode pad 1b. These openings 7a and 7b are used as openings for forming solder plating when forming the solder bumps.

Figure 2B:
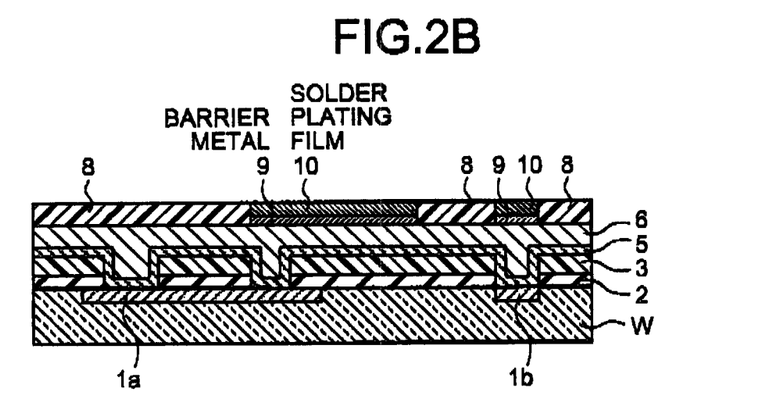

After the resist pattern 8 has been formed on the first conducting layer 6, as shown in FIG. 2B, as a barrier metal 9 for a solder bump, for example, a nickel (Ni) film of thickness 350 nm is formed inside the openings 7a and 7b by using the technique of plating. Subsequently, as a solder plating film 10, for example, Cu and tin (Sn) films are formed in this order with film thicknesses of 0.12 μm and 6 μm, respectively inside the openings 7a and 7b. The barrier metal 9 is operative to suppress diffusion of Sn contained in later-described solder bumps 12a and 12b.

Figure 2C:
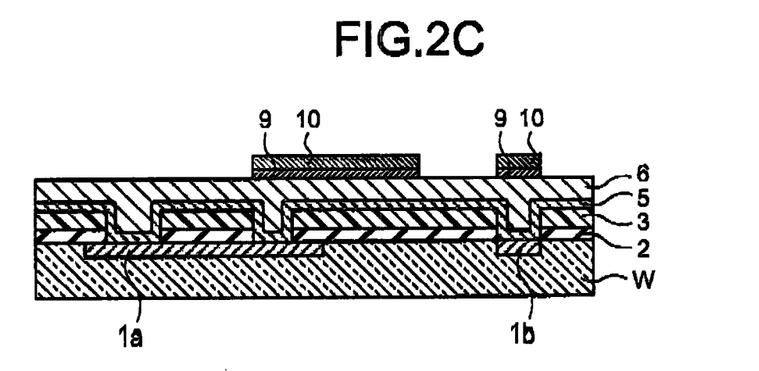
Figure 3A:
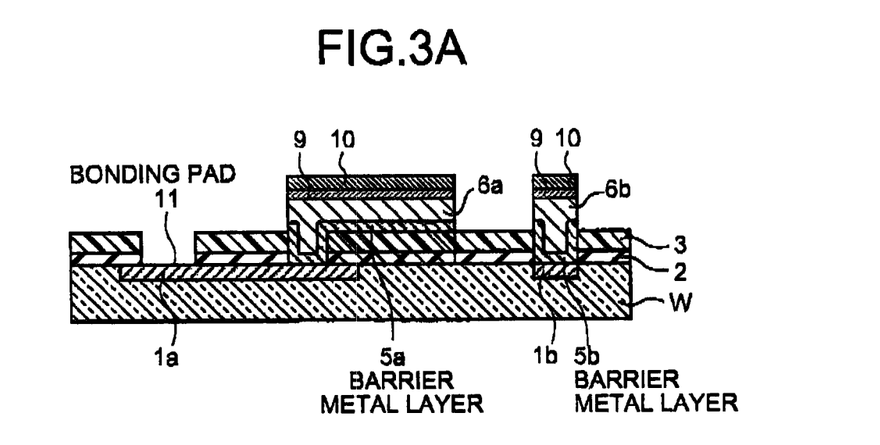
FIGS. 3A and 3B are schematic diagrams illustrating a manufacturing method in accordance with an embodiment of the present invention.

Next, as shown in FIG. 2C, the resist pattern 8 is delaminated using, for example, a chemical solution such as a resist separation solution. Subsequently, as shown in FIG. 3A, anisotropic etching is performed by using the solder plating film 10 as an etching mask to remove the first conducting layer 6, which is a Cu layer, and the barrier metal layer 5, which is a Ti layer, for portions other than that is covered with the solder plating film 10.

With this, the first conducting layer 6 (Cu layer) and the barrier metal layer 5 (Ti layer) are made patterning in the same shape as the solder plating film 10, and relocation wiring layers 6a and 6b (Cu wiring layers) and barrier metal layers 5a and 5b that have been made patterning in the same shape as the solder plating film 10 are formed under the solder plating film 10. This relocation wiring layer 6a is electrically connected to the electrode pad 1a through the barrier metal layer 5a, and the relocation wiring layer 6b is electrically connected to the electrode pad 1b through the barrier metal layer 5b. In addition, a bonding pad 11 for wire bonding is formed at the electrode pad 1a.

Figure 3B:
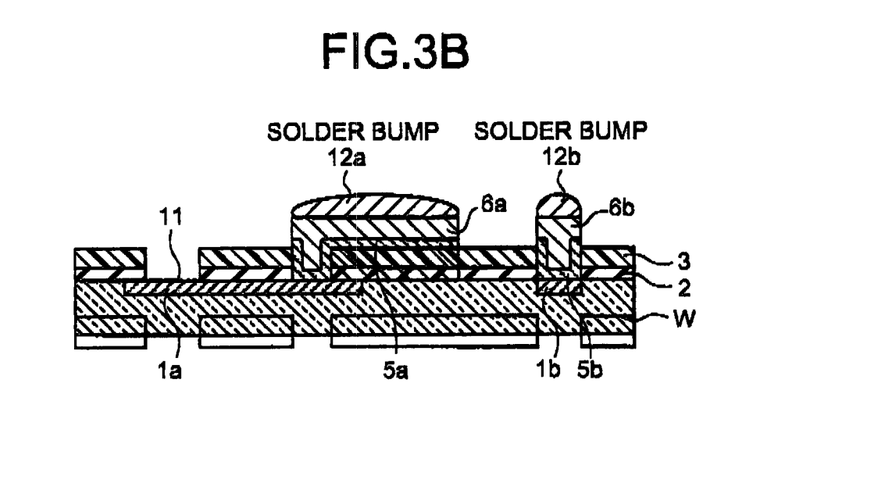

After that, a reflow process is performed to first melt and then solidify the solder plating film 10. At this time, the barrier metal 9 is allowed to dissolve in the solder plating film 10. With this, as shown in FIG. 3B, the solder bumps 12a and 12b can be directly formed on the relocation wiring layers 6a and 6b (or on the barrier metal 9).

As described above, in the manufacturing method in accordance with the first embodiment, because the relocation wiring layers 6a and 6b are formed by using the technique of sputtering, the relocation wiring layers 6a and 6b having an electric resistance that is lower than that when they are formed by using the technique of plating can be formed.

In addition, because the solder bumps 12a and 12b are directly formed on the relocation wiring layers 6a and 6b, or, on the barrier metal 9, an UBM layer for solder plating with a high electric resistance such as Ti does not exist, thereby enabling to manufacture a semiconductor apparatus with a reduced resistance between chips.

Moreover, because the solder bumps 12a and 12b are not formed after formation of the relocation wiring layers 6a and 6b, i.e., because the relocation wiring layers 6a and 6b are formed by using the solder plating film 10 as a mask, resists need not be formed in the patterns of the relocation wiring layers 6a and 6b, and the solder bumps 12a and 12b, respectively, thereby enabling to manufacture the relocation wiring layers 6a and 6b, and the solder bumps 12a and 12b with simpler and fewer steps.

Figure 4A:
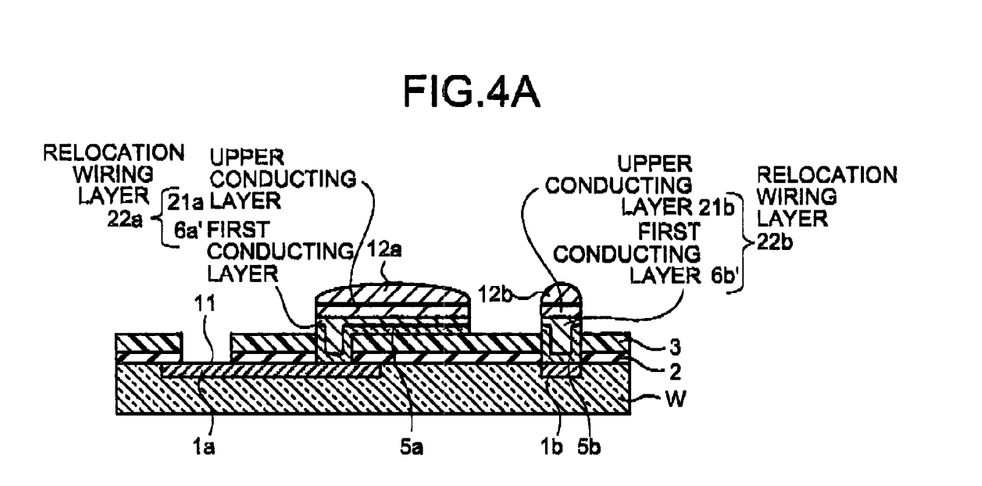
FIGS. 4A to 4C are schematic diagrams illustrating a manufacturing method in accordance with an embodiment of the present invention.

A second embodiment of the present invention is explained below. FIGS. 4A to 5C are schematic diagrams illustrating a manufacturing method of a semiconductor apparatus in accordance with the second embodiment. Explanations that overlap with the explanations of the first embodiment are abbreviated. First, FIG. 4A depicts a configuration of a semiconductor apparatus manufactured by a manufacturing method in accordance with the second embodiment.

The semiconductor apparatus in accordance with the second embodiment differs from the semiconductor apparatus in accordance with the first embodiment in that the semiconductor apparatus in accordance with the second embodiment includes a relocation wiring layer 22a and a relocation wiring layer 22b in place of respectively the relocation wiring layer 6a and the relocation wiring layer 6b of the semiconductor apparatus in accordance with the first embodiment. The relocation wiring layer 22a includes a first conducting layer 6a' formed by using the technique of sputtering and an upper conducting layer (Cu plating layer) 21a formed by using the technique of plating. On the other hand, the relocation wiring layer 22b includes a first conducting layer 6b' formed by using the technique of sputtering and an upper conducting layer (Cu plating layer) 21b formed by using the technique of plating.

The first conducting layer 6a' and the first conducting layer 6b' are thinner (thickness 1 μm) than the relocation wiring layer 6a and the relocation wiring layer 6b, respectively. Moreover, the relocation wiring layer 22a and the relocation wiring layer 22b are thicker than the relocation wiring layer 6a and the relocation wiring layer 6b, respectively.

In the semiconductor apparatus in accordance with the second embodiment, because the relocation wiring layer 22a and the relocation wiring layer 22b are thicker than the relocation wiring layer 6a and the relocation wiring layer 6b in the first embodiment, respectively, wiring resistance can be reduced than the semiconductor apparatus in accordance with the first embodiment. The semiconductor apparatus in accordance with the second embodiment can suppress the increase of wiring resistance even when the high integration of the semiconductor apparatus advances and wiring interval becomes narrow, thereby enabling to respond to the high integration of the semiconductor apparatus.

Figure 4B:
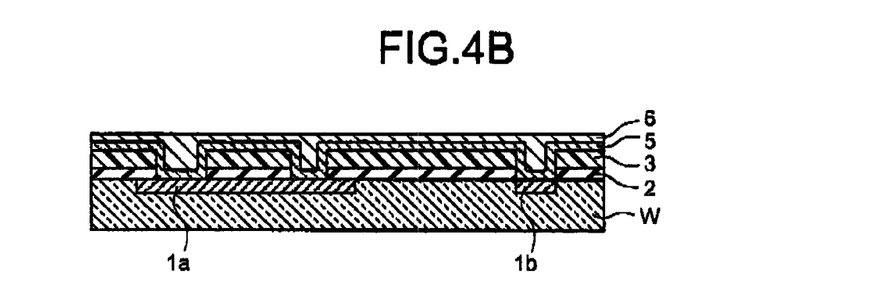

In the semiconductor apparatus in accordance with the second embodiment, after forming the first conducting layer 6 by using the technique of sputtering in the same manner as in the first embodiment, the upper conducting layers (Cu plating layers) 21a and 21b can be formed on this first conducting layer 6 by using the technique of plating method. Specifically, in the same manner as in the first embodiment, manufacturing process is proceeded up to the step as shown in FIG. 1B. Next, as shown in FIG. 4B, a Ti film of thickness 100 nm as the barrier metal layer 5 and a Cu film of thickness 1 μm as the first conducting layer 6 are formed by using the technique of sputtering as UBM layers on the entire surface of a wafer W.

Figure 4C:
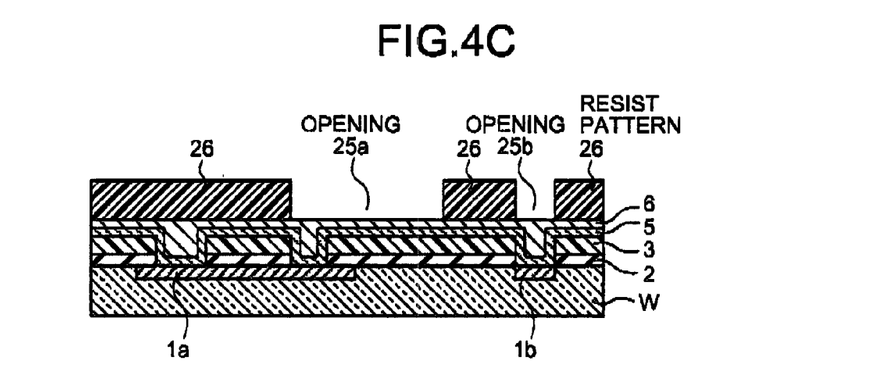

After the barrier metal layer 5 and the first conducting layer 6 have been formed, as shown in FIG. 4C, a resist pattern 26 as a mask layer having openings 25a and 25b is formed on the first conducting layer 6 by a normal lithography process of photoresist application, exposure, and development. These openings 25a and 25b are formed at positions where relocation wirings and solder bumps are to be formed. Specifically, the opening 25a is formed on a region including the electrode pad 1a, and the opening 25b is formed on the electrode pad 1b.

Figure 5A:
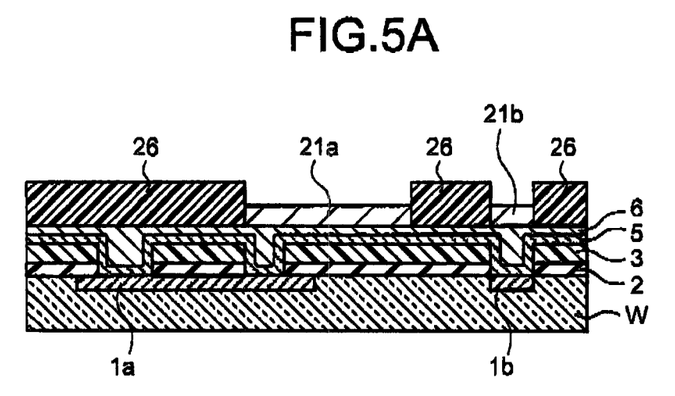
FIGS. 5A to 5C are schematic diagrams illustrating a manufacturing method in accordance with an embodiment of the present invention.
Figure 5B:
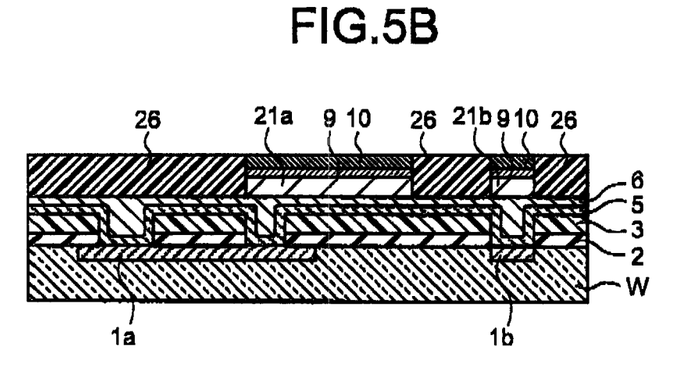

After the resist pattern 26 has been formed on the first conducting layer 6, as shown in FIG. 5A, the upper conducting layers (Cu plating layers) 21a and 21b are formed inside the openings 25a and 25b, respectively, with a film thickness of 5 μm using the technique of plating. Subsequently, as shown in FIG. 5B, as the barrier metal 9 for a solder bump, for example, a nickel (Ni) film is formed inside the openings 25a and 25b with a film thickness of 350 nm by using the technique of plating. Furthermore, as the solder plating film 10, for example, Cu and tin (Sn) films are formed in this order inside the openings 25a and 25b with film thicknesses of 0.12 μm and 6 μm, respectively.

Figure 5C:
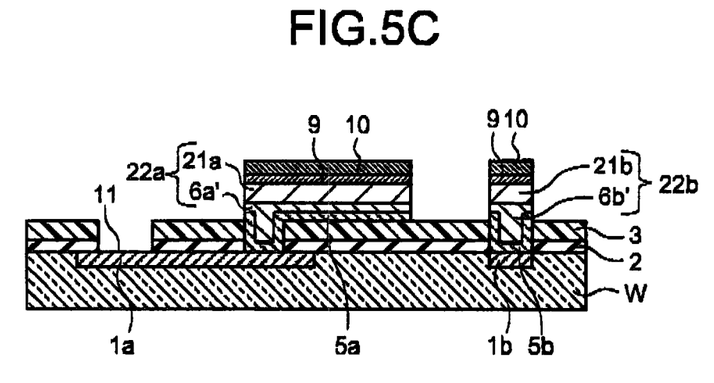

Next, the resist pattern 26 is delaminated using, for example, a chemical solution such as a resist separation solution. Next, as shown in FIG. 5C, anisotropic etching is performed by using the solder plating film 10 as an etching mask to remove the first conducting layer 6, which is a Cu layer, and the barrier metal layer 5, which is a Ti layer, for portions other than that is covered with the solder plating film 10. That is, the first conducting layer 6 (Cu layer) and the barrier metal layer 5 (Ti layer) are made patterning in the same shape as the solder plating film 10. At this time, the first conducting layer 6 is formed thinner than that in the first embodiment, thereby enabling to easily perform patterning using the anisotropic etching.

With this, the relocation wiring layer 22a consisting of the first conducting layer 6a' formed by using the technique of sputtering and the upper conducting layer (Cu plating layer) 21a formed by using the technique of plating, and the relocation wiring layer 22b consisting of the first conducting layer 6b' formed by using the technique of sputtering and the upper conducting layer (Cu plating layer) 21b formed by using the technique of plating are formed under the solder plating film 10. In addition, the bonding pad 11 for wire bonding is formed at the electrode pad 1a.

After that, a reflow process is performed to first melt and then solidify the solder plating film 10. As a result, as shown in FIG. 4A, the solder bumps 12a and 12b can be directly formed on the relocation wiring layers 22a and 22b, (or on the barrier metal 9).

As described above, in the manufacturing method in accordance with the second embodiment, conducting layers for the relocation wiring layers are formed by combining the techniques of sputtering and plating, thereby enabling to manufacture conducting layers for the relocation wiring layers more easily and with greater thickness than to form the conducting layers by using only the technique of sputtering.

Figure 6A:
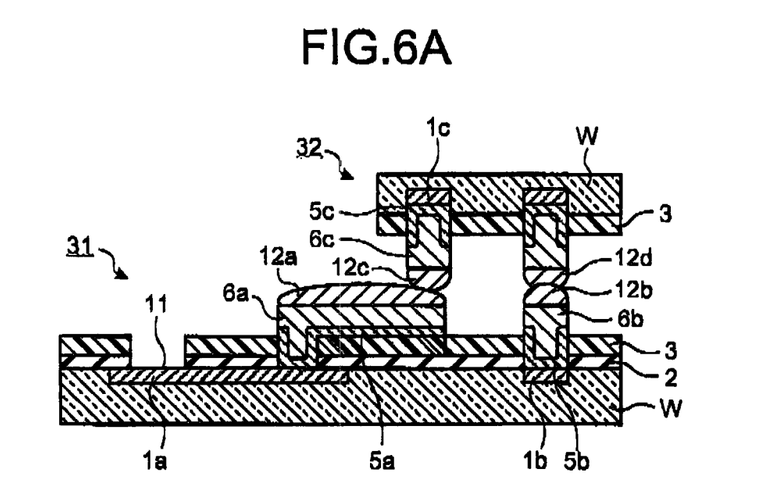
FIGS. 6A and 6B are schematic diagrams illustrating a semiconductor apparatus in accordance with an embodiment of the present invention.
Figure 6B:
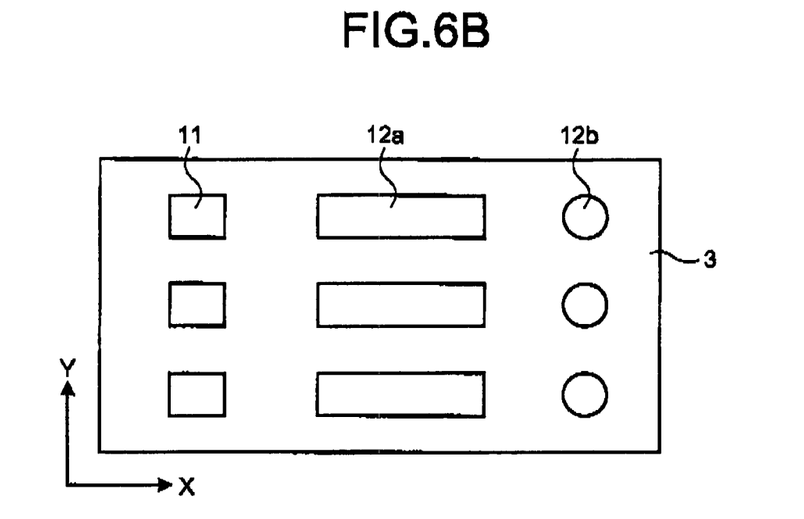

A third embodiment of the present invention is explained below. FIGS. 6A and 6B are schematic diagrams illustrating a state in which the logic chip 31 and the memory chip 32 (for example, DRAM), whose relocation wiring layers having a substantially rectangular planar shape in an in-plane direction of a substrate W are manufactured using the method explained in the first embodiment, are flip-chip interconnected to each other. FIG. 6A depicts an arrangement of the logic chip 31 and the memory chip 32. In the example shown in FIG. 6A, the memory chip 32 is arranged on the logic chip 31, and those two chips are connected to each other. FIG. 6B depicts a top view of the logic chip 31 when viewed from the side that the relocation wiring layer 6a is formed. In the logic chip 31, solder spreads over the entire surface of the relocation wiring layer 6a.

In order to definitely connect the solder bump 12a of the logic chip 31, which is arranged in the lower side, with a solder bump 12c of the memory chip 32, which is arranged in the upper side, a connection part with the solder bump 12c at the solder bump 12a is preferable to have a substantially spherical shape and a predetermined height. However, in the example shown in FIGS. 6A and 6B, a shape in the in-plane direction of the substrate W of the relocation wiring layer 6a is substantially rectangular, and the solder is arranged on the entire surface of the relocation wiring layer 6a. Due to this, during the reflow process, the solder spreads over the entire surface of the relocation wiring layer 6a, so that the solder does not attain a substantially spherical shape.

Figure 7A:
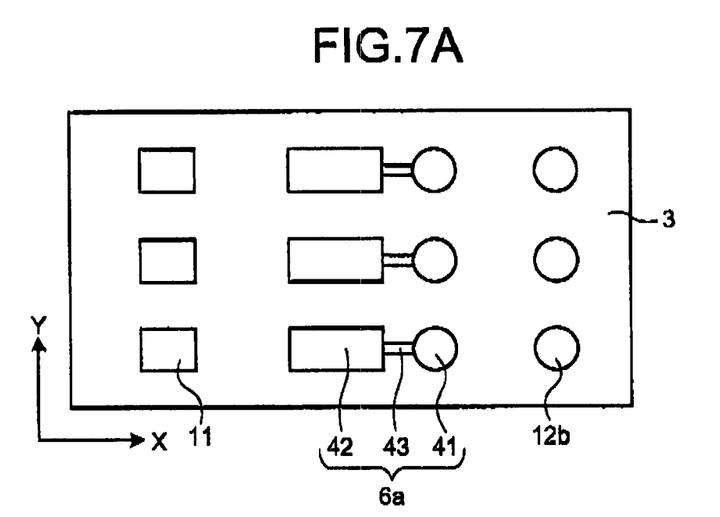
FIGS. 7A and 7B are schematic diagrams illustrating a semiconductor apparatus in accordance with an embodiment of the present invention.

FIG. 7A depicts another top view of the logic chip 31 when viewed from the side in that the relocation wiring layer 6a is formed) by transmitting the solder bumps 12a and 12b. The shape of the relocation wiring layer 6a in the horizontal plane, i.e., XY plane is explained below. Specifically, the relocation wiring layer 6a is elongated in the length direction (X direction), and one end of the relocation wiring layer 6a, i.e., the end to which the solder bump 12a is connected, is made to be a circular portion 41 that has a substantially circular shape, and the other end is made to be a rectangle portion 42 that has a substantially rectangular shape. Furthermore, a portion of the relocation wiring layer 6a that continues to the circular portion 41 and connects the circular portion 41 with the rectangle portion 42 is made thinner than the circular portion 41 and has a nipped-in shape, and made to be a narrow-width wiring portion 43 in which the size in the width direction (Y direction in FIG. 7A) is made thinner than the circular portion 41 and the rectangle portion 42.

Figure 7B:
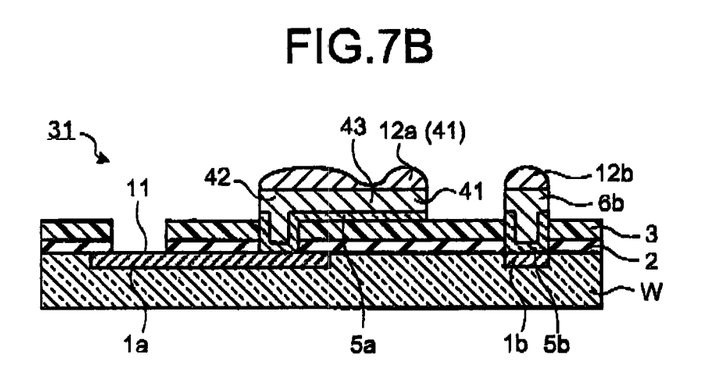

As described above, by making the portion that continues to the circular portion 41 as the narrow-width wiring portion 43 that is thinner than the circular portion 41 and has a nipped-in shape, during the reflow process, the solder is restrained to flow from near a connection portion with the solder bump 12c into the direction of the rectangle portion 42. Because of this, as shown in FIG. 7B, the solder bump 12a, i.e., the circular portion 41, having substantially spherical shape and a predetermined height can be formed.

Figure 8A:
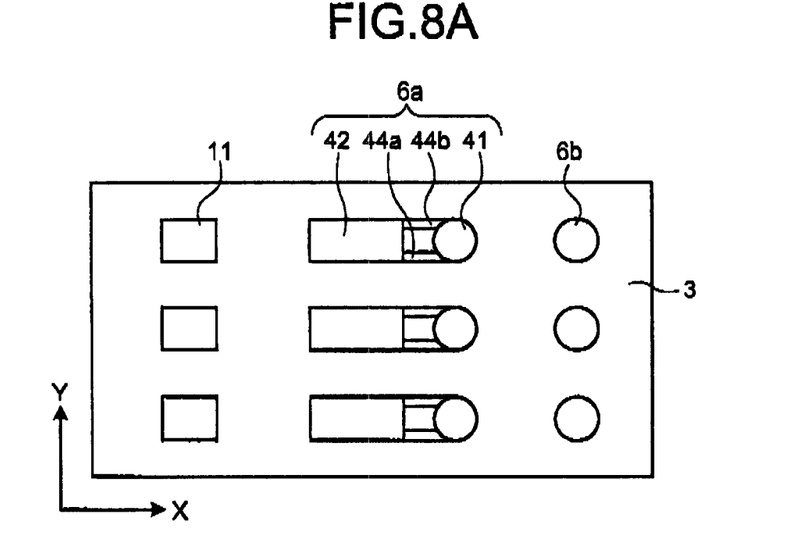
FIGS. 8A and 8B are schematic diagrams illustrating a semiconductor apparatus in accordance with an embodiment of the present invention.

As another structure, for example, as shown in FIG. 8A, the narrow-width wiring portion can be divided into two narrow-width wiring portions: a narrow-width wiring portion 44a and a narrow-width wiring portion 45b. Even in this structure, during the reflow process, the solder is restrained to flow from near the connection portion with the solder bump 12c into the direction of the rectangle portion 42. Because of this, the solder bump 12a, i.e., the circular portion 41, having substantially spherical shape and predetermined height can be formed.

Figure 8B:
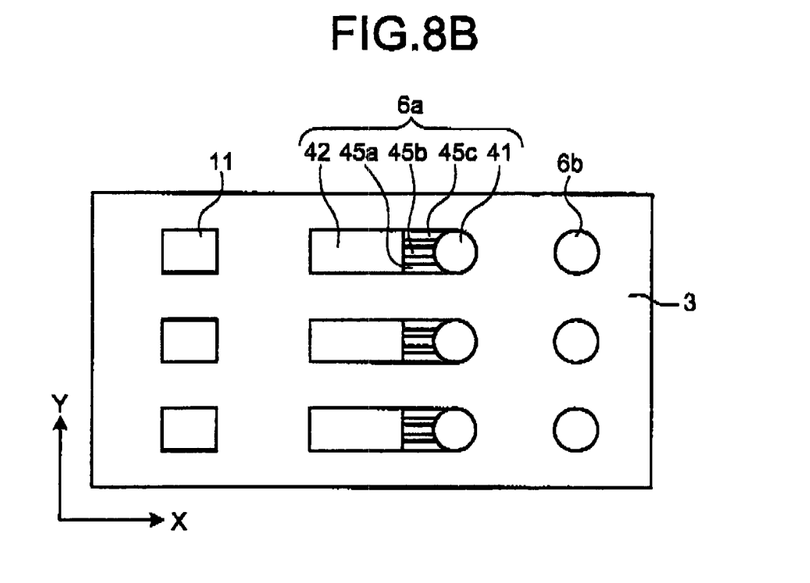

As another structure, for example, as shown in FIG. 8B, the narrow-width wiring portion can be divided into three narrow-width wiring portions: a narrow-width wiring portion 45a, the narrow-width wiring portion 45b, and a narrow-width wiring portion 45c. Even in this structure, during the reflow process, the solder is restrained to flow from near the connection portion with the solder bump 12c into the direction of the rectangle portion 42. Because of this, the solder bump 12a, i.e., the circular portion 41, having substantially spherical shape and a predetermined height can be formed.

As described above, by enlarging the size in the width direction (Y direction) of the narrow-width wiring portion by increasing the number of narrow-width wiring portions, cross-section area of the narrow-width wiring portion can be enlarged, thereby enabling to suppress the narrow-width wiring portion from becoming high resistance.

Figure 9:
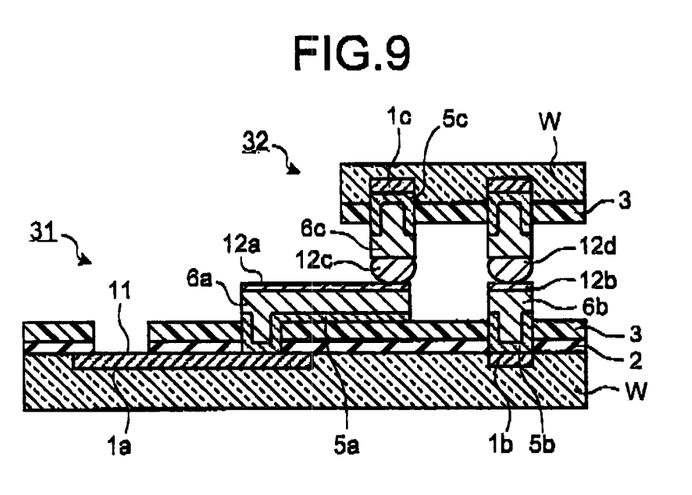
FIG. 9 is a schematic diagram illustrating a semiconductor apparatus in accordance with an embodiment of the present invention.

A fourth embodiment of the present invention is explained below. FIG. 9 is a schematic diagram illustrating a connection of the logic chip 31 and the memory chip 32 in accordance with a fourth embodiment of the present invention. In the example shown in FIG. 9, the logic chip 31 and the memory chip 32 are flip-chip interconnected to each other, and the memory chip 32 is arranged on the logic chip 31.

The logic chip 31 and the memory chip 32 are manufactured using the manufacturing method explained in the first embodiment. However, solder bumps are formed so that amount of solder in the solder bump 12a of the logic chip 31 are less than the amount of solder in the solder bump 12c of the memory chip 32. The amount of solder means the (average) amount of solder per unit area on a conductive layer (Cu layer).

With this, during chip connection (during the reflow process), in the solder bump 12a of the logic chip 31, melted solder is restrained to flow from near a connection portion with the solder bump 12c into a direction to separate from the connection portion, thereby enabling to definitely connect the solder bump 12a of the logic chip 31 with the solder bump 12c of the memory chip 32.

Furthermore, it is allowed to make a composition of the solder bump 12a of the logic chip 31 be different from the composition of the solder bump 12c of the memory chip 32 so that the melting point of the solder bump 12c is lower than the melting point of the solder bump 12a.

In this instance, during chip connection (during the reflow process), only the solder bump 12c is melted by performing a heat treatment at a temperature that is higher than or equal to the temperature of the melting point of the solder bump 12c and lower than the temperature of the melting point of the solder bump 12a. Because of this, during chip connection (during the reflow process), the solder of the solder bump 12a is more definitely restrained to flow from near the connection portion with the solder bump 12c into the direction to separate from the connection portion, thereby enabling to definitely connect the solder bump 12a of the logic chip 31 with the solder bump 12c of the memory chip 32.

In addition, FIGS. 6A and 9 have shown a structure that the solder bump 12c is formed on an electrode pad 1c through a barrier metal layer 5c and a conducting layer 6c in also the memory chip 32, similar to the logic chip 31. However, in the memory chip 32 side, a relocation wiring is not necessary, in particular, and the solder bump 12c is allowed to be directly formed on the barrier metal layer 5c (barrier metal 9) as an UBM layer. Moreover, in FIGS. 6A to 9, while an instance of the logic chip manufactured using a method in accordance with the first embodiment is explained, it will be obvious that a logic chip in which the relocation wiring layer is manufactured using the manufacturing method in accordance with the second embodiment is also allowed to be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor apparatus comprising:
    first forming including forming a first conducting layer on a side of a main surface on which an electrode terminal of a semiconductor device is provided in a semiconductor substrate, the first conducting layer being electrically connected to the electrode terminal of the semiconductor device;
    second forming including forming a mask layer that has an opening at a predetermined position on the first conducting layer;
    third forming including forming a second conducting layer inside the opening of the mask layer;
    removing, after the third forming, the mask layer that has the opening at a predetermined position;
    fourth forming including forming a relocation wiring that includes the first conducting layer and electrically draws out the electrode terminal by performing anisotropic etching for the first conducting layer using the second conducting layer as a mask; and
    fifth forming including forming a bump on the relocation wiring by causing the second conducting layer to reflow,
    wherein the third forming includes forming a third conducting layer inside the opening of the mask layer by plating and then forming the second conducting layer above the third conducting layer,
    wherein after the mask layer is removed in the removing, the fourth forming includes forming the relocation wiring that includes the first conducting layer and the third conducting layer by performing the anisotropic etching for the first conducting layer, and wherein the film thickness of the third conducting layer is thicker than the film thickness of the first conducting layer.

2. The manufacturing method according to claim 1, wherein the first forming includes forming the first conducting layer by sputtering.

3. The manufacturing method according to claim 1, wherein the first forming includes forming a first barrier metal layer on the side of the main surface of the semiconductor substrate and then forming the first conducting layer on the first barrier metal layer; and after the mask layer is removed at the removing, the fourth forming includes forming the relocation wiring by performing the anisotropic etching for the first barrier metal layer and the first conducting layer using the second conducting layer as a mask.

4. The manufacturing method according to claim 3, wherein the first forming includes forming the first barrier metal layer and the first conducting layer by sputtering.

5. The manufacturing method according to claim 1, wherein the third forming includes forming a second barrier metal layer inside the opening of the mask layer and then forming the second conducting layer on the second barrier metal layer.

6. The manufacturing method according to claim 1, wherein the third forming includes forming a second barrier metal layer on the third conducting layer and then forming the second conducting layer on the second barrier metal layer.

7. The manufacturing method according to claim 1, wherein the relocation wiring includes a first region that a shape in an in-plane direction of the semiconductor substrate is made to be substantially circular, and a second region that continues into the first region and is narrower than the first region and a nipped-in shape.

8. The manufacturing method according to claim 7, wherein the second regions are provided in plurality.

9. The manufacturing method according to claim 1, wherein the first conducting layer is a copper film.

* * * * *